United States Patent [19]

Chance et al.

[11] Patent Number: 5,169,310
[45] Date of Patent: Dec. 8, 1992

[54] HERMETIC PACKAGE FOR AN ELECTRONIC DEVICE AND METHOD OF MANUFACTURING SAME

[75] Inventors: Dudley A. Chance, Newton, Conn.; David B. Goland, Bedford Hills; Ho-Ming Tong, Yorktown Heights, both of N.Y.

[73] Assignee: International Business Machines Corp., Armonk, N.Y.

[21] Appl. No.: 757,863

[22] Filed: Sep. 11, 1991

Related U.S. Application Data

[62] Division of Ser. No. 418,435, Oct. 6, 1989.

[51] Int. Cl.$^5$ .................................................. F27D 5/00
[52] U.S. Cl. .................................. 432/258; 432/249; 432/251; 264/57; 264/61
[58] Field of Search ............... 432/258, 253, 261, 249, 432/251, 231; 264/57, 61

[56] References Cited

U.S. PATENT DOCUMENTS

| | | | |
|---|---|---|---|
| 4,919,614 | 4/1990 | Kitagawa et al. | 432/258 |
| 5,106,295 | 4/1992 | Misawa | 432/253 |
| 5,130,067 | 7/1992 | Haitz et al. | 432/258 |

*Primary Examiner*—Henry C. Yuen
*Attorney, Agent, or Firm*—Ira D. Blecker

[57] ABSTRACT

A hermetic package for an electronic device is manufactured by providing a green glass ceramic body with a green via to produce a workpiece. The workpiece is sintered at a temperature at or above 500° C., while compressing the workpiece at a pressure at or above 100 pounds per square inch, so as to obtain a hermetic package. The green via comprises a mixture of copper and a glass ceramic material with a sufficient volume of glass to produce a hermetic package, yet with sufficient copper to have a suitable electrical conductivity.

The hermetic package thus produced comprises a sintered glass ceramic body having an electrically conductive sintered via which is hermetically bonded to the glass ceramic body and which comprises a mixture of an electrically conductive material and a glass ceramic material. The electrically conductive material forms at most 50 volume percent of the via.

The workpeice may be sintered in a sintering fixture having a frame and a compensating insert. The compensating insert and frame bound a sintering chamber for accommodating the workpiece. By providing a frame having a thermal expansion coefficient greater than that of the workpiece, and by providing a compensating insert having a thermal expansion coefficient greater than that of the frame, a close fit can be assured between the workpiece and the sintering fixture over a large range of temperatures.

5 Claims, 3 Drawing Sheets

HERMETIC PACKAGE FOR AN ELECTRONIC DEVICE AND METHOD OF MANUFACTURING SAME

This is a division of Ser. No. 07/418,435 filed Oct. 6, 1989, and is related to Ser. No. 07/757,747, entitled "Hermetic package for a electronic device," filed Sep. 11, 1991.

BACKGROUND OF THE INVENTION

The invention relates to hermetic packages or hermetic substrates for electronic devices. The invention also relates to methods and apparatus for manufacturing such hermetic packages or substrates.

Many electronic devices, such as semiconductor integrated circuits, must be packaged in clean inert atmospheres for obtaining reliable operation over long lifetimes. In addition to being hermetic, such packages must provide electrical connections between the circuits inside the package and external devices outside of the package. Often the package also provides electrical connections between different points on the circuit or circuits inside the package. Such a package may comprise, for example, a hermetic substrate sealed to a hermetic lid by way of a flange so as to form an enclosed chamber containing one or more electronic devices.

One type of known electronic device package (see, for example, U.S. Pat. No. 4,234,367) consists of a multilayer glass ceramic substrate. On one side, the substrate has termination pads for attaching electronic devices. On the other side, the substrate has termination pads for making external connections.

Each layer of glass ceramic may be provided with one or more electrically conductive thick film lines on the surfaces of the layer, and one or more electrically conductive vias passing through the layer. The vias connect electrically conductive thick film lines and/or termination pads on opposite surfaces of the layer. Vias which extend to termination pads on the substrate surface must be accurately positioned at locations corresponding to the locations of terminals on the electronic devices to be packaged.

Such multilayer glass ceramic substrates are manufactured by producing a slurry of glass particles in a binder. The slurry is cast and dried into green sheets. Via holes are punched through the green sheets in desired configurations, and a copper paste is extruded into the via holes. A copper paste is also screen printed onto the green sheets in a desired conductor pattern to form line interconnections and voltage planes. A plurality of sheets are laminated by pressing above the glass transition temperature of the green sheets (typically 70°-100° C.). Finally, the laminated sheets are sintered.

After sintering, the substrates may exhibit certain structural irregularities that may adversely affect the hermeticity of the substrate. Consequently, it has been known to "back fill" the gaps and cracks in the substrate with a polymer or other sealing material after completion of sintering, in order to obtain a hermetic substrate. Such an additional processing step is, however, costly and time consuming.

After the substrate is "back filled", the opposite surfaces of the substrate must be ground and polished flat and parallel to each other to provide suitable mounting surfaces for electronic components and external connections. It is important that the conductive vias be nondistorted so that termination pads are properly aligned with electronic components and external connections to be mounted on the substrate.

SUMMARY OF THE INVENTION

It is an object of the invention to produce a sintered multilayer glass ceramic substrate having electrically conductive vias containing a metal, which substrate is hermetic without post-sintering processing.

It is another object of the invention to produce a sintered multilayer glass ceramic substrate having electrically conductive vias, which substrate has substantially no structural irregularities.

It is a further object of the invention to produce a sintered multilayer glass ceramic substrate having non-distorted electrically conductive vias.

According to the invention, a hermetic package for an electronic device comprises a sintered glass ceramic body which is substantially electrically insulating. An electrically conductive sintered via in the glass ceramic body extends from the first surface of the glass ceramic body to the second surface of the glass ceramic body. The via is hermetically bonded to the glass ceramic body. The via comprises a mixture of an electrically conductive material and a glass ceramic material. The electrically conductive material forms at most (50) volume percent of the via.

In a method according to the present invention of manufacturing a hermetic package for an electronic device, a green glass ceramic body is provided with a green via extending through the body from the first surface to the second surface of the body. The green via comprises a mixture of an electrically conductive material and a glass ceramic material. The workpiece formed by the via-containing glass ceramic body is compressed at a pressure at or above 100 pounds per square inch while sintering the workpiece at a temperature at or above 500° C. so as to obtain a hermetic package.

The present invention is advantageous because by pressure sintering a green glass ceramic body containing green vias comprising a mixture of electrically conductive material and a glass ceramic material, the vias will hermetically bond to the glass ceramic body. Consequently, a post-sintering sealing step will not be needed.

Preferably, in the method according to the present invention the workpiece is sintered at a pressure which is sufficiently high that the pressure sintering densification rate is much greater than the free sintering (unpressurized sintering) densification rate.

It is also preferred, according to the present invention, that the green via (i.e. prior to sintering) consists essentially of 20 to 50 volume percent copper, and 80 to 50 volume percent glass ceramic material.

In order to assure that the vias passing through the glass ceramic body remain undistorted with respect to the surfaces of the glass ceramic body, edge distortion must be avoided during pressure sintering. According to an aspect of the present invention, edge distortion is avoided by varying the pressure on the workpiece during sintering as a function of the thickness and the edge profile or width of the workpiece. Preferably, the workpiece is compressed at a pressure, P, substantially given by the equation $$P = \gamma n^{\frac{1}{3}} \left(\frac{4\pi}{3}\right)^{\frac{1}{3}} \left(\frac{1}{D} - 1\right)^{\frac{1}{3}} \left(\frac{R^2}{h^2}\right)$$

where $\gamma$ is the surface tension of the workpiece, D is the ratio of the density of the workpiece divided by the theoretical maximum density of the workpiece, R is the radius of the workpiece, h is the height of the workpiece, and n is the pore density in the workpiece.

In another aspect of the invention, the workpiece is compressed until the workpiece has a selected thickness.

Edge distortion of the workpiece can be avoided, according to another embodiment of the invention, by providing a sintering fixture to support the edges of the workpiece during pressure sintering. In this embodiment of the invention, a sintering fixture comprises a frame and a compensating insert arranged inside the frame. The frame has a thermal expansion coefficient $\alpha_A$, and the compensating insert has a thermal expansion coefficient $\alpha_B$. The compensating insert and the frame bound a sintering chamber for accommodating the workpiece. In order to avoid crushing or distorting the workpiece on cooling after completion of the pressure sintering, since the thermal expansion coefficient $\alpha_C$ of the workpiece is less than the thermal expansion coefficient $\alpha_A$ of the frame, the thermal expansion coefficient $\alpha_B$ of the compensating insert is made much greater than the thermal expansion coefficient $\alpha_A$ of the frame.

Preferably, the frame has a length $l_A$ in a first direction, the compensating insert has a length $2l_B$ in the first direction, and the workpiece has a length $l_C$ in the first direction such that $$2l_B = \frac{\alpha_A - \alpha_C}{\alpha_B - \alpha_a} \times l_C + \frac{1}{(\alpha_B - \alpha_A)\delta T} \times 2d$$

and $$l_A = l_C + 2l_B + 2d$$

where 2d is a desired gap between the fixture and the workpiece at room temperature, and where $\delta T$ is the difference between room temperature and the pressure sintering temperature.

The sintering fixture according to the present invention is advantageous because by suitable choice of the thermal expansion coefficients of the workpiece, the frame, and the compensating insert, the edge of the workpiece will be supported by the sintering fixture in a temperature range from room temperature through the maximum pressure sintering temperature.

DESCRIPTION OF THE PREFERRED EMBODIMENTS

Figure 1:
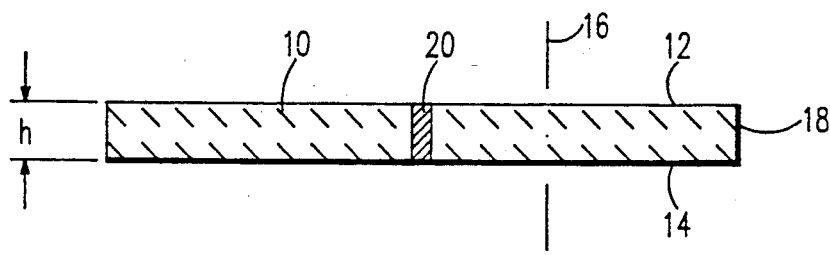
FIG. 1 is a cross-sectional view of a hermetic package according to the present invention.

FIG. 1 shows a simple hermetic package for an electronic device. The hermetic package comprises a sintered glass ceramic body 10. The sintered glass ceramic body 10 has first and second opposite surfaces 12 and 14. An imaginary axis 16 extends from the first surface 12 to the second surface 14. The glass ceramic body has a thickness or height, h, in the direction of the axis 16. The glass ceramic body 10 also has an edge 18 which connects the surfaces 12 and 14. The glass ceramic body is substantially electrically insulating.

The hermetic package also comprises at least one electrically conductive sintered via 20 in the glass ceramic body 10. The via 20 is hermetically bonded to the glass ceramic body 10. The via comprises a mixture of an electrically conductive material and a glass ceramic material. The electrically conductive material forms at most 50 volume percent of the via.

Examples of glass ceramic materials which may be used to form the glass ceramic body 10 are given in U.S. Pat. No. 4,234,367 and U.S. Pat. No. 4,301,324, the disclosures of which are incorporated by reference herein. Cordierite glasses, mullite glasses, or other glasses which can be heated to crystallization can also be used. Mixtures of noncrystallizing glasses and ceramics may also be used. For purposes of illustration, and not of limitation, several glass ceramic compositions that may be used according to the present invention are listed in Table I.

TABLE I

| | GLASS CERAMIC COMPOSITIONS (WEIGHT PERCENT) | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 |
| $SiO_2$ | 55.0 | 54.5 | 54.5 | 52.3 | 57.8 | 60.0 | 50.0 | 53.9 | 54.0 | 55.0 | 60.0 | 54.5 | 57.0 | 55.0 | 47.0 | 53.9 | 54.0 | 54.5 | 54.0 | 54.0 |
| $Al_2O_3$ | 21.1 | 21.0 | 21.0 | 19.7 | 22.2 | 18.2 | 22.9 | 20.7 | 21.0 | 21.0 | 17.0 | 20.0 | 21.0 | 21.0 | 33.5 | 20.8 | 22.0 | 21.3 | 22.0 | 21.0 |
| MgO | 22.3 | 19.8 | 19.8 | 24.0 | 16.0 | 17.8 | 22.2 | 19.6 | 19.0 | 18.0 | 18.0 | 20.0 | 20.0 | 22.0 | 13.5 | 19.6 | 20.0 | 19.9 | 20.0 | 22.0 |
| $B_2O_3$ | 1.2 | 1.0 | 1.0 | 1.0 | 1.0 | 1.0 | 1.1 | 1.0 | 1.0 | 1.0 | 1.0 | 1.0 | 1.0 | 2.0 | 3.0 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 | 1.0 | | 3.0 | 2.7 | 2.0 | 2.8 | 2.0 | |
| $CeO_2$ | | 1.0 | | | | | | | | | | | | | | | | | | |
| MnO | | | 1.0 | | | | | | | | | | | | | | | | | |
| $ZrO_2$ | | | | | | | | | 2.0 | | | | 2.0 | | | | | | | |
| CaO | | | | | | | | | | 2.0 | | 1.0 | | | | | | | | |
| NiO | | | | | | | | | | | 2.0 | | | | | | | | | |
| $Li_2O$ | | | | | | | | | | | | 1.0 | | | | | | | | |
| $Fe_2O_3$ | | | | | | | | | | | | | | | | | | | 2.0 | |
| $Na_2O$ | | | | | | | | | | | | | | | | | | | | 1.0 |

TABLE I-continued

| | GLASS CERAMIC COMPOSITIONS (WEIGHT PERCENT) | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 |
| $TiO_2$ | | | | | | | | | | | | | | | | | | 1.0 | | |
| ZnO | | | | | | | | | | | | | | | | | | | 1.0 | |
| CuO | | | | | | | | | | | | | | | | | | | | 2.0 |

Examples of materials which may be used to form the via are any of the glass ceramic materials described above, mixed with 20 to 50 volume percent copper, gold, palladium, silver, nickel, or alloys thereof.

In order to provide a good electrical connection through the hermetic package, the sintered via 20 preferably has an electrical resistivity less than 1000 microhm-centimeters.

Figure 2:
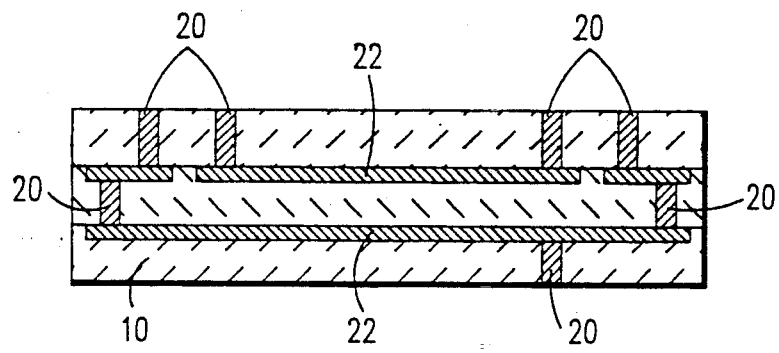
FIG. 2 is a cross-sectional view of another embodiment of a hermetic package according to the present invention.

FIG. 2 shows an example of a more complex hermetic package comprising a trilayer sintered glass ceramic body 10. A number of electrically conductive sintered vias 20 are provided through the various layers of glass ceramic body 10. In this example, the hermetic package further includes electrically conductive thick film lines 22 for electrically connecting one or more vias 20 to each other. The exposed surfaces of vias 20 form terminations for connection to electronic devices to be packaged, or for external connections.

The thick film lines 22 may comprise, for example, a copper paste or ink. Alternatively, the lines 22 may comprise other metals such as silver or gold or alloys thereof.

Figure 3:
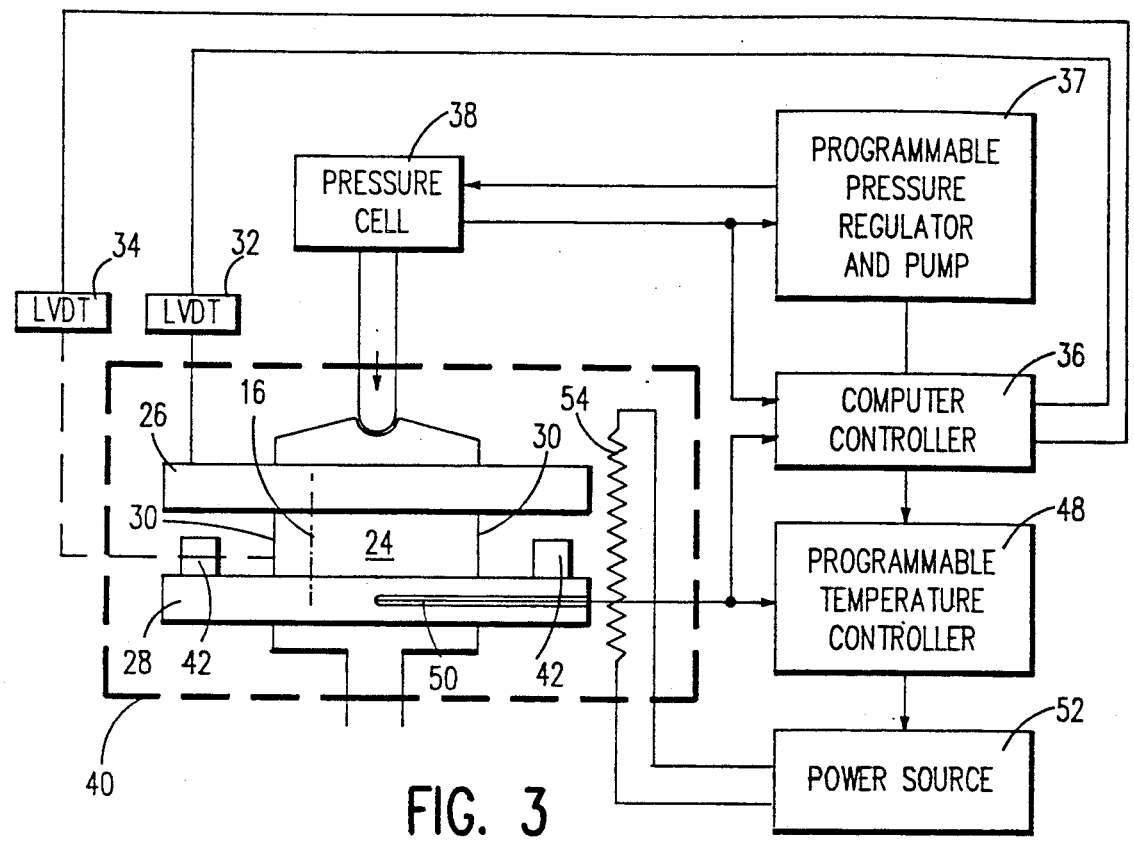
FIG. 3 is a schematic view of a pressure sintering apparatus for use in a method according to the present invention of manufacturing a hermetic package.

A hermetic package, such as those shown in FIGS. 1 and 2, is manufactured according to the present invention by first providing a green (unfired) glass ceramic body which is substantially electrically insulating, and providing one or more green (unfired) vias in the green glass ceramic body. The green glass ceramic body and the green vias from a workpiece 24 as shown in FIG. 3. According to the present invention, the workpiece 24 is sintered at a temperature at or above 500° C. At the same time the workpiece 24 is compressed at a pressure at or above 100 pounds per square inch while sintering the workpiece, so as to obtain a hermetic package.

Sintering refers to the process of transforming the initially highly porous workpiece into a highly dense module. When the workpiece is sintered without being compressed, the workpiece has a free sintering densification rate. When the workpiece is sintered while being compressed, it has a pressure sintering densification rate. According to a first embodiment of the invention, the pressure sintering densification rate is much greater than the free sintering densification rate.

In order to obtain a hermetic bond between the via and the glass ceramic body, it is preferable that the green via consists essentially of at least 50 volume percent glass ceramic material. However, in order to maintain a sufficiently high electrical conductivity, the green via should contain not less than 20 volume percent copper.

A first embodiment of the method according to the present invention for manufacturing a hermetic package is shown in FIG. 3. The workpiece 24 is compressed between upper die 26 and lower die 28.

While the workpiece 24 is compressed between dies 26 and 28, it is important that the edges 30 of the workpiece 24 are not deformed. Therefore, according to the invention, means 32 are provided for measuring the thickness of the workpiece, means 34 are provided for measuring the width or edge bulge 30 of the workpiece, and means 36, 37 and 38 are provided for varying the pressure on the workpiece as a function of the measured thickness and as a function of the measured edge bulge (or width) of the workpiece.

The means 32 and 34 for measuring the thickness and edge of the workpiece may be linear variable displacement transducers (LVDT's). The pressure controller 36 may be, for example, a general purpose digital computer for controlling a programmable pressure regulator and pump 37, which in turn applies pressure to workpiece 24 by way of pressure cell 38. The pressure may be supplied by a hydraulic press 38. The workpiece 24 and the dies 26 and 28 are arranged inside a furnace 40, schematically illustrated.

In the method, a programmable temperature controller 48 controls the sintering temperature according to a preselected temperature schedule. Temperature controller 48 measures the furnace temperature by way of thermocouple 50, and regulates the furnace temperature by way of power source 52 and heater element 54.

Deformation of the edges 30 of the workpiece 24 may be avoided during pressure sintering by varying the pressure as a function of the thickness, edge bulge, and relative density of the workpiece. This functional relationship can be derived in the following manner.

Figure 4:
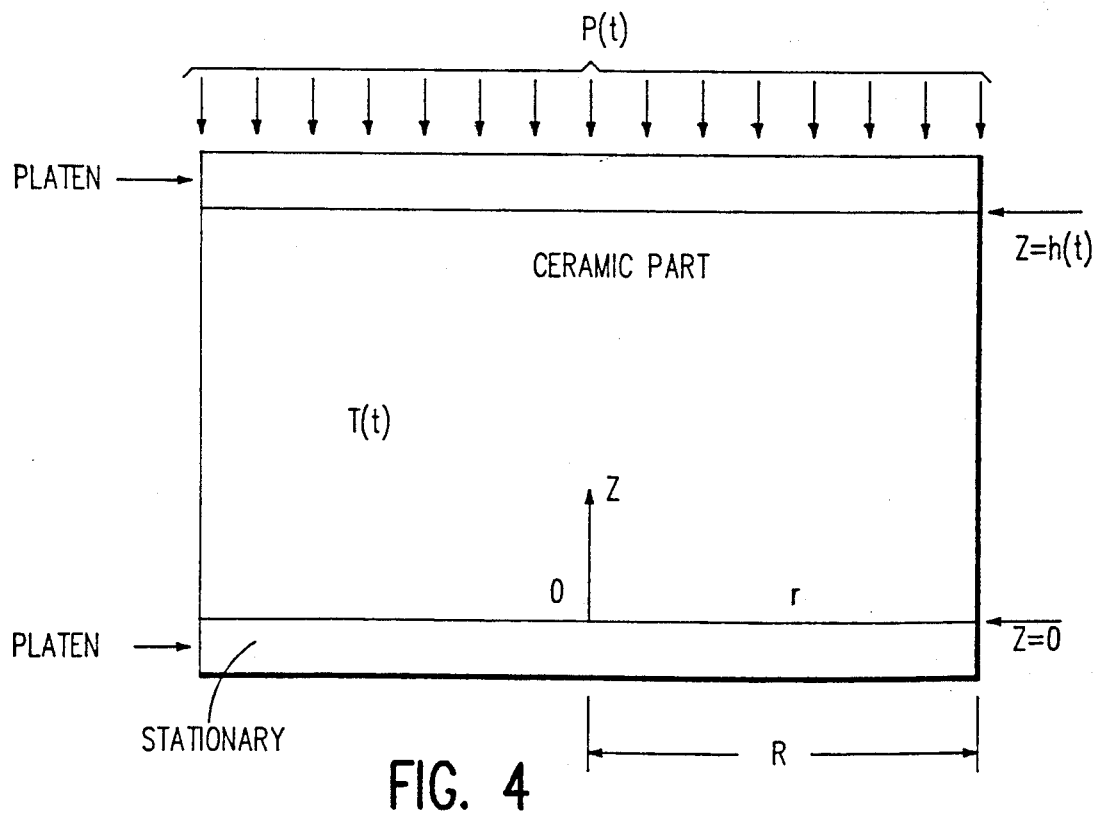
FIG. 4 is a schematic illustration of the manufacture of a hermetic package by pressure sintering.

Consider the sintering of a circular, porous glass ceramic module (FIG. 4) of initial density, $\rho_0$, initial thickness, $h_0$, and constant radius, R, under a pressure schedule P[t] and a temperature schedule T[t] where t is the time elapsed after the start of the experiment.

For the sintering of ceramics, the Reynolds number of the flow is so small (due to the very high glass viscosities, e.g., $>10^9$ poise for our glass ceramics) that the inertia terms in the equations of motion are negligible. Also, because the aspect ratio, R/h (h being the thickness of the module at any time t), is typically much greater than unity, the two flow velocities, $V_r$ and $V_z$, satisfy the simplified Navier-Stokes equation $$\frac{dp[r]}{dr} = \eta \left( \frac{\partial^2 v_r[r,z]}{\partial z^2} \right) \tag{1}$$

and the continuity equation $$\frac{1}{r} \frac{\partial}{\partial r}(rv_r) + \frac{\partial v_z}{\partial z} = -\frac{\dot{\rho}}{\rho} \tag{2}$$

based on the assumption that the glass ceramic is a Newtonian substance. In Equations 1 and 2, r and z signify the lateral and axial directions shown in FIG. 4, p is the dynamic pressure defined as the pressure above the ambient, $\eta$ is the viscosity, and $\rho$ is the module density which is assumed to vary only with time. The viscosity can depend on temperature, and time if crystallization is involved (see Equation 6 below).

The initial and boundary conditions associated with Equations 1 and 2 are typical of squeeze-flow situations:

$$\rho = \rho_0 \text{ at } t=0 \tag{3a}$$

$$h = h_0 \text{ at } t=0 \quad (3b)$$

$$v_z = 0 \text{ at } z=0 \quad (3c)$$

$$v_z = \dot{h} = \frac{dh}{dt} \text{ at } z = h \quad (3d)$$

$$v_r = 0 \text{ at } z=0, h \quad (3e)$$

$$p = 0 \text{ at } r=R \quad (3f)$$

$$\pi R^2 P = 2\pi \int_0^R p r \, dr \quad (3g)$$

The mathematical system defined by Equations 1-3 contains two unknowns, namely, the viscosity, $\eta$, and the density, $\rho$. To determine the density variation with time during sintering, an expression covering a wide range of pressures has been proposed by Murray et al ("Practical and Theoretical Aspects of the Hot Pressing of Refractory Oxides,"; *Transactions British Ceramic Society;* Volume 53, 1954, pages 474-510) for molding applications:

$$\frac{dD}{dt} = \left(\frac{4\pi}{3}\right)^{\frac{1}{3}} \frac{3\gamma n^{\frac{1}{3}}}{2\eta} (1 - D)^{\frac{2}{3}} D^{\frac{1}{3}} \left[1 + \frac{P}{2\gamma n^{\frac{1}{3}}} \left(\frac{1-D}{D}\right)^{\frac{1}{3}} \left(\frac{3}{4\pi}\right)^{\frac{1}{3}}\right] \quad (4)$$

where $D = \rho/\rho f$, $\rho f$ is the fully sintered density, $\gamma$ is the surface tension, and n is the number of pores per cm$^3$ of the module which is intimately connected to the particle size of the module. For our glass ceramics, $\gamma \sim 360$ dynes/cm (Giess et al. *J. Amer. Ceram. Soc.*, 1984, Vol. 67, pages 549 et seq.), and n is assumed to be identical to that reported by Murray et al., (i.e., $n = 1.58 \times 10^8/\text{cm}^3$) due to lack of data.

We shall use Equation 4 to calculate the density under either isothermal or dynamic heating conditions with the understanding that both the pressure and viscosity can vary with time. Because the local pressure effective for sintering is the hydrodynamic pressure which varies in the lateral direction, r, due to the absence of a die, we shall replace P in Equation 4 with the effective pressure $$\bar{P} = \frac{\int_0^R P \, dr}{R} \quad (5)$$

which will be evaluated later.

In a manner analogous to that occurring during curing of a polymer, the viscosity, $\eta$ of a glass ceramic can be represented by the dual-Arrhenius expression (Roller, M. B. "Characterization of the Time-Temperature-Viscosity Behavior of Curing B-Staged Epoxy Resin", *Polymer Eng. Sci.*, Jun. 1975, Vol. 15, No. 6, pages 406-414):

$$\ln \eta[t,T] = \ln \eta_\infty + \frac{\Delta E_\eta}{R'T} + k_\infty \int_0^t \exp\left[\frac{-\Delta E_k}{R'T}\right] dt \quad (6)$$

where $R'$ is the universal gas constant and $\eta_\infty$, $\Delta E_\eta$, $K_\infty$ AND $\Delta E_k$ are constant parameters. This expression accounts for both an exponential viscosity decay with temperature due to softening of the glass (first two terms on the right-hand side), and a linear viscosity increase due to crystallization according to a first-order kinetics (the last term on the right-hand side).

It must be noted that the last two terms on the right-hand side require knowledge of the thermal history of the module for their evaluation. Thus, interestingly enough, even two fluid elements having the same temperature at some time could have very different viscosities if their temperatures at previous times were not identical.

Whenever a temperature non-uniformity exists in the ceramic module the trajectory of each fluid element must be evaluated, in general, to determine the spatial distribution of the viscosity of the glass ceramic. This can be done, in principle, by solving the energy conservation equation together with the equations of motion for a given set of initial and boundary conditions. In this study, however, it was assumed that the viscosity at a given time does not depend on position or, equivalently, the temperature which governs the viscosity is uniform.

The parameters in Equation 6 can be obtained by, for example, performing some isothermal parallel-plate rheometry experiments at temperatures covering the temperature range of interest using reasonably non-porous samples. (Tong et al. "Prediction of Thermoset Viscosity Using a Thermomechanical Analyzer", *Journal of Applied Polymer Science*, 1986, Vol. 31, pages 2509-2522.) Once the parameters are known, Equation 6 can be used to predict the viscosity history under a wide variety of temperature schedules. When the effect of crystallization on the viscosity has not been established fully, it is necessary to resort to the viscosity-temperature relationship up to some maximum temperature where the crystallization effect is likely to become important.

Solving for the mathematical system (Equations 1-3), we obtain $$\dot{h} = \frac{-2Ph^3}{3R^2\eta} - \frac{h\dot{\rho}}{\rho} \quad (7)$$

indicating that the sample thickness, h, is controlled by the competition between a lamination flow term (first term on the right-hand side) which is proportional to the ratio of the applied pressure, P, to the sample's cross sectional area, $A(=\pi R^2)$, and a sintering flow term (second term on the right-hand side) which depends on the pore closing pressure (or the applied pressure) but not on the sample area. Therefore, when the lamination flow term is dominating, one expects the thickness to depend on the pressure to area ratio. On the other hand, when the sintering flow term dominates, the thickness is insensitive to the sample area. Accompanying Equation 7 are $\bar{P} = 4P/3$ and the velocity profiles $$v_z = -\frac{z}{\rho}\dot{\rho} - \frac{2P}{3R^2\eta} z^2(3h - 2z) \quad (8)$$

-continued $$v_r = \frac{2Pr}{R^2\eta}(z^2 - zh) \quad (9)$$

Note here that the expression of $V_z$ contains a sintering or density contribution (first term on the right-hand side) and a lamination contribution. The sintering contribution disappears in the expression of $V_r$, i.e., the lamination flow. This is due to the much smaller sintering flow in the lateral direction compared to that in the thickness direction—a direct manifestation of immobile module surfaces. According to $V_r$ alone, the edge always bulges outward. This is inconsistent with the shrink-in edge observed at low pressures (e.g., <5 psi.) for our glass ceramics. The discrepancies here were due to the increasing importance of the lateral sintering flow at low pressures. No expression is yet available to describe this retarded sintering flow in the lateral direction. As an approximation, we assume that at the center between the two surfaces of the module (i.e., at z=h/2 and r=R), the material sinters or shrinks in accordance with the free sintering law at a speed, $\lambda$ where $$\lambda = -\frac{R}{2}\left(\frac{\gamma n^{\frac{1}{3}}}{\eta}\right)\left(\frac{4\pi}{3}\right)^{\frac{1}{3}}\left(\frac{1}{D}-1\right)^{\frac{1}{3}} \quad (10)$$

If one allows the edge to shrink conformally (i.e., at all z's) according to Equation 10 instead of just at the center (i.e., if $\lambda = \dot R$ with R now varying with time) and if Equation 10 also governs the thickness changes (i.e., $\lambda = \dot h$), then Equation 10 is equivalent to Equation 4 with P=0. With $\lambda$, the edge bulge, $\theta$, is given by $$\theta = \int_0^t (v_r - \lambda)dt \text{ at } Z = \frac{h}{2}, r = R \quad (11)$$

Depending on the sign of $\theta$, the edge either bulges outward ($\theta > 0$) or shrinks inward ($\theta < 0$). According to Equation 11, the condition for a flat edge ($\theta = 0$) rests upon setting $V_r = \lambda$ at all times. This yields the pressure schedule $$P = \gamma n^{\frac{1}{3}}\left(\frac{4\pi}{3}\right)^{\frac{1}{3}}\left(\frac{1}{D}-1\right)^{\frac{1}{3}}\frac{\left(R_0 + \frac{\theta}{2}\right)^2}{h^2} \quad (12)$$

where $R_o$ is the initial radius of the workpiece. From Equation 12, it can be seen that the pressure schedule required for a flat edge depends on the thickness, h, the edge bulge, $\theta$, and the relative density, D.

Thus, in an embodiment of the invention, the LVDT 32 measures the thickness of the workpiece 24, and the LVDT 34 measures the width or edge bulge of the workpiece 24. The relative density D is calculated by controller 36 based on the known mass of the workpiece and based on the measurements of h and $\theta$.

Pressure controller 36 varies the pressure on the workpiece 24 as a function of the measured thickness, the measured edge bulge, and the relative density of the workpiece according to the pressure schedule of Equation 12.

When the measured edge bulge $\theta$ exceeds a selected limit, controller 36 releases the pressure on workpiece 24. This allows free sintering to reduce the edge bulge. When the edge bulge is back within the selected limit, the pressure is reapplied according to Equation 12. When the desired sample thickness is reached, controller 36 releases the pressure for the remainder of the process.

Edge deformation can be minimized in another aspect of the invention by providing stops 42 between the dies 26 and 28. (FIG. 3.) By compressing the workpiece 24 until the upper die 26 contacts the stops 42 and the workpiece has a selected thickness, edge deformation can be minimized.

It is important to avoid edge deformation in hermetic packages containing vias, because edge deformation is also associated with via deformation. Consequently, when edge deformation is avoided, then via deformation is also avoided.

Deformed vias will not properly align with either termination pads deposited on the tops of the vias, or electrical contacts on electronic components to be mounted on the hermetic package.

As shown in FIG. 3, when the edges 30 of the workpiece 24 are supported only by the workpiece itself in a direction transverse to the axis 16 of the workpiece, edge deformation is avoided by suitably controlling the pressure on the workpiece. In another embodiment of the invention, however, a sintering fixture is provided for supporting the edges 30 of the workpiece.

Figure 5:
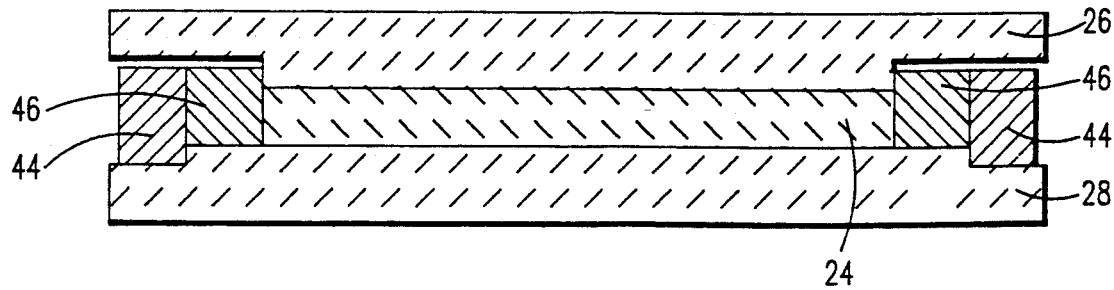
FIG. 5 is a cross-sectional view of an apparatus for use in an embodiment of the method according to the present invention for manufacturing a hermetic package.
Figure 6:
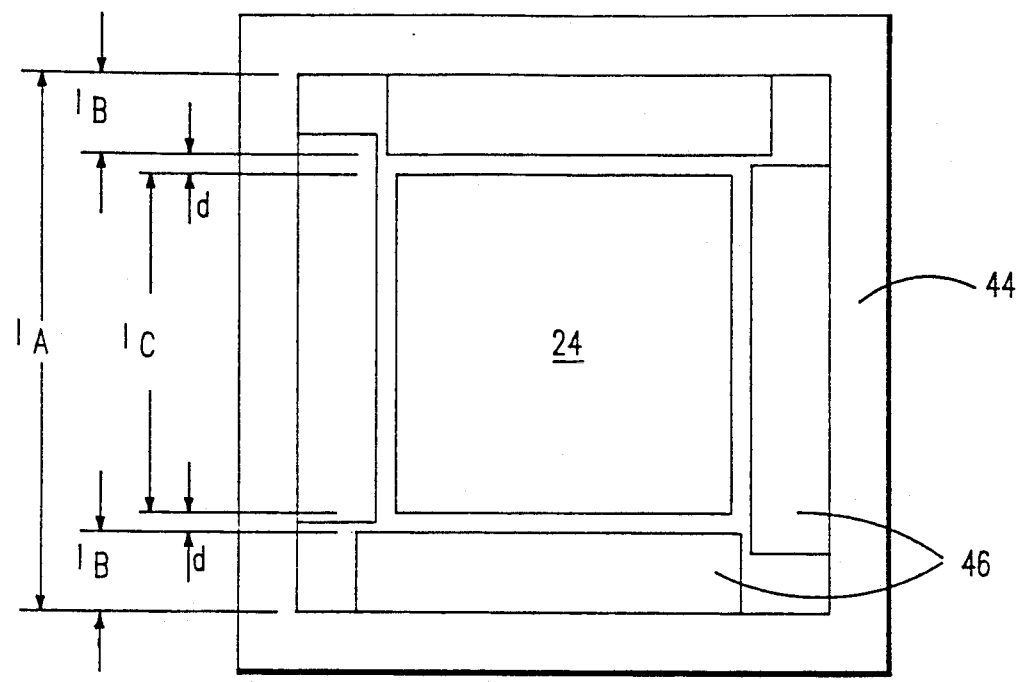
FIG. 6 is a top plan view of a sintering fixture according to the present invention for pressure sintering a workpiece to form a hermetic package.

Referring to FIGS. 5 and 6, the sintering fixture according to the invention comprises a frame 44 and compensating inserts 46 arranged inside the frame 44. The compensating inserts 46 and the frame 44 bound a sintering chamber for accommodating the workpiece 24. The bottom of the sintering chamber is formed by the lower die 28 of FIG. 5, and the top of the sintering chamber is formed by the upper die 26.

The geometry of the sintering fixture is shown in FIG. 6. As shown therein, the frame 44 has a length $l_A$ in a first direction. Compensating inserts 46 have lengths $l_B$ in the first direction. The workpiece 24 has a length $l_C$ in the first direction. In order to be able to easily remove the sintered workpiece 24 from the fixture after firing, and in order to avoid crushing or distorting the workpiece on cooling after the pressure sintering, two small gaps having lengths d are provided between the fixture and the workpiece at room temperature. The thermal expansion coefficients of the frame, the compensating insert, and the workpiece are $\alpha_A$, $\alpha_B$ AND $\alpha_C$, respectively.

The desired gaps between the workpiece 24 and the sintering fixture can be provided on cooling the sintered workpiece to room temperature if the following relationships hold.

$$l_A\alpha_A\delta T = 2l_B\alpha_B\delta T + l_C\alpha_C\delta T - 2d, \quad (13)$$

and $$\iota_A = l_C + 2l_B + 2d, \quad (14)$$

where $\delta T$ is the change in temperature of the sintering fixture and workpiece. The dimensions $l_A$, $l_B$, $l_C$ and d are all taken at room temperature.

Substituting Equation 14 into Equation 13 (and recognizing the $\alpha_A\delta T$ is much less than 1 for sintering in the range of 1000° C.) yields;

$$2l_B = \frac{(\alpha_A - \alpha_C)}{(\alpha_B - \alpha_A)} l_C + \frac{2d}{(\alpha_B - \alpha_A)\delta_T} \qquad (15)$$

The same relationship can be used to ensure a close fit between the workpiece 24 and the sintering fixture at all temperatures in a direction perpendicular to $l_A$, $l_B$, and $l_C$.

In order to obtain the best results, the sintering fixture should be made of materials which resist oxidation and which resist adhering to the workpiece. For example, the sintering fixture may be molybdenum. The compensating insert may be, for example, copper, nickel, or stainless steel. A release coating such as alumina powder may be provided on fixture surfaces which contact the workpiece.

The operation of the sintering fixture according to the invention is as follows. On heating, the frame 44 expands more than the workpiece 24. However, the compensating insert 46 expands more than frame 44 so as to eliminate gap d at the sintering temperature. On cooling, the compensating insert shrinks more than frame 44 so the gap d reappears.

The invention will become more apparent after referring to the following examples.

EXAMPLE 1

A crystallizable (cordierite) glass as disclosed in U.S. Pat. No. 4,301,324 was ground into a powder.

The glass powder was mixed with a binder of Butvar (trademark), a polyvinylbutyral resin, dipropylglycoldibenzoate plasticizer, and methanol/methyl isobutylketone solvent to form a slurry.

The slurry was cast into green sheets on a Mylar (trademark) substrate by doctor blading, followed by drying in air. The dry green sheets were blanked to required dimensions, and via holes were punched in desired configurations.

Metalizing paste was screen printed onto the cut green sheets to fill the via holes. The metalizing paste was formed by mixing copper powder with a crystallizable glass powder as described above. The copper and glass mixture was also provided with a binder of ethyl cellulose and terpineol.

A first metalizing paste contained 40 volume percent copper. A second metalizing paste contained 47 volume percent copper, and a third contained 55 volume percent copper.

Samples were produced by stacking and laminating 45 screen-printed green sheets. The laminated assemblies were heated in an $H_2/H_2O$ atmosphere to burn out polymeric material and residual carbon. The burnout was performed by heating at 1°–3° C. per minute to 785°±10° C., and holding at that temperature for 3–5 hours. The ratio of $H_2$ to $H_2O$ started at $10^{-6}$, and was changed continuously to $10^{-4}$ from 400° C. to the burnout temperature. Thereafter, the atmosphere was changed to $N_2$ to remove dissolved water, and the assemblies were cooled to room temperature at 5° C. per minute.

The stacked and laminated sheets were then sintered in a nitrogen-rich atmosphere of hydrogen and nitrogen as follows. The temperature of the stacked and laminated workpiece was raised by 5° C. per minute to 750° C. After holding the temperature at 750° C. for thirty minutes, the workpiece was compressed in a sintering fixture containing a compression stop. Some samples were compressed at 200 pounds per square inch, others at 400 pounds per square inch, and others at 800 pounds per square inch.

Immediately after the initiation of the compression, the temperature was raised 2° C. per minute to 870° C. The temperature of 870° C. was maintained with the pressure for two hours.

Finally, after two hours at 870° C., the compressive load was removed, and the temperature was decreased 5° C. per minute down to room temperature.

The hermeticity of each substrate was tested by applying a fluorescent dye (for example, Magnaflux) to the surface of the substrate, and allowing the fluorescent dye to penetrate the surface. After several minutes, excess dye was removed by rinsing and drying the surface. The substrate was then let sit for a few minutes to allow any dye which penetrated the substrate to rise back to the surface. Each substrate was then examined under ultraviolet light to observe the presence of any dye.

No fluorescence was observed adjacent vias with 40 and 47 volume percent copper, indicating good hermeticity. Fluorescence was observed at the via/substrate interface for vias containing 55 volume percent copper, indicating the presence of structural irregularities, thereby indicating a lack of hermeticity.

Additional samples were thermally cycled between room temperature and 360° C. Samples were subjected to up to 20 thermal cycles. For vias containing 40 volume percent copper, dye tests yielded no apparent fluorescence at the via/substrate interface, thereby indicating good hermeticity. For vias containing 47 volume percent copper and 55 volume percent copper, fluorescence was observed, indicating dye penetration and therefore no hermeticity.

Electrical resistance measurements were made of the hermetic vias with 40% copper using a four-point-probe technique. The average resistivity was 35.0 microohm-centimeter.

EXAMPLE 2

A crystallizable (cordierite) glass as disclosed in U.S. Pat. No. 4,340,436 was ground into a powder.

The glass powder was mixed with a binder of ethyl cellulose and copper powder to form a metalizing paste. A first metalizing paste contained 30 volume percent copper. A second metalizing paste contained 40 volume percent copper, and a third contained 55 volume percent copper.

The metalizing paste was cast into layers on a Mylar (trademark) substrate by doctor blading, followed by drying in air. Additional layers were applied by doctor blading followed by drying until 100 mil thick laminates were obtained.

One inch square wafers were then cut from the laminates. Polymeric material and residual carbon was burned off in the same manner as in Example 1. The burned off laminates were pressure sintered in the same manner as Example 1.

Figure 7:
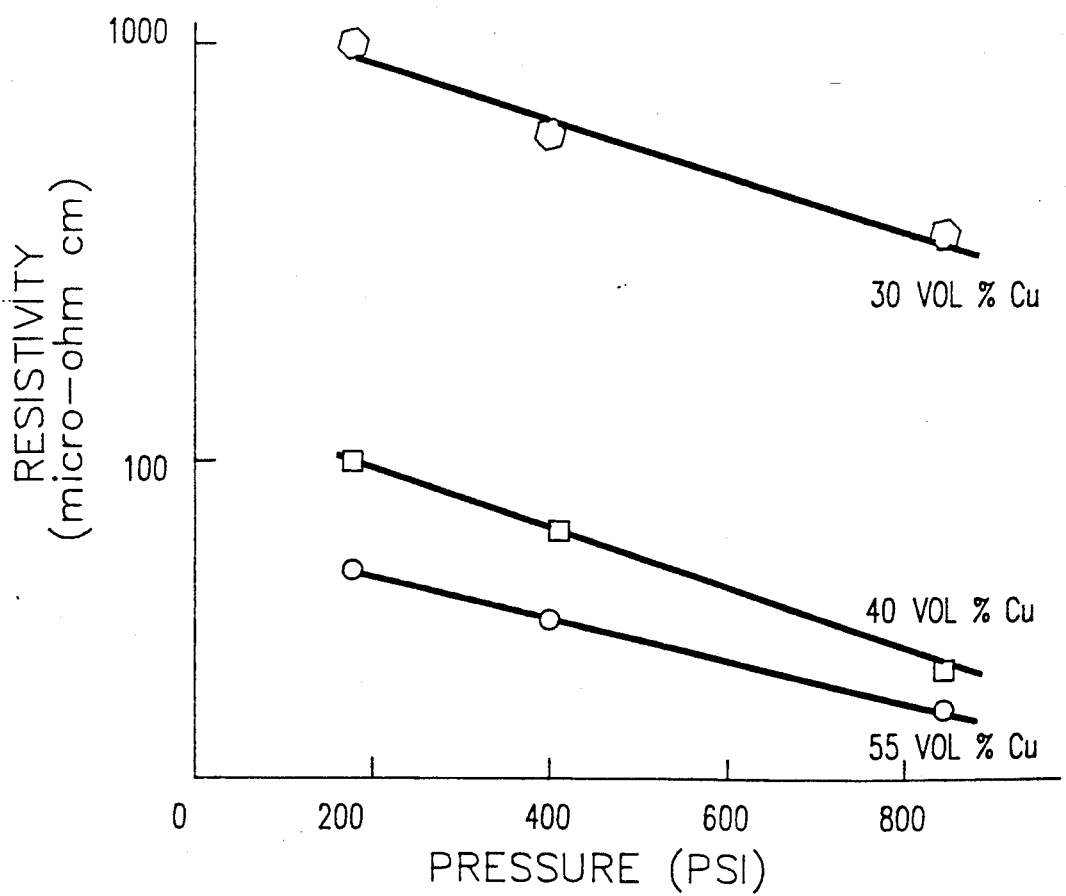
FIG. 7 is a plot of resistivity versus sintering pressure for several via paste compositions according to the invention.

The resistivities of the sintered wafers were measured with a four point probe measurement apparatus. The results are shown in FIG. 7. In all three cases (that is, with vias containing 30 volume percent copper, 40 volume percent copper, and 55 volume percent copper), the resistivity decreased as the compressive load increased.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A sintering fixture for pressure sintering a workpiece having a thermal expansion coefficient $\alpha_C$, said fixture comprising:

a frame having a thermal expansion coefficient $\alpha_A$; and a compensating insert arranged inside the frame, said compensating insert and frame bounding a sintering chamber for accommodating the workpiece, said compensating insert having a thermal expansion coefficient $\alpha_B$;

characterized in that $\alpha_C < \alpha_A < \alpha_B$.

2. A sintering fixture as claimed in claim 1, characterized in that:

the frame has a length $l_A$ a first direction;

the compensating insert has a length $l_B$ in the first direction;

the workpiece has a length $l_C$ in the first direction;

$$2l_B = \frac{(\alpha_A - \alpha_C)}{(\alpha_B - \alpha_A)} l_C + \frac{2d}{(\alpha_B - \alpha_A)\delta T}$$

and $$l_A = l_C + 2l_B + 2d,$$

where d is a desired gap between the fixture and the workpiece at room temperature, and where $l_A$, $l_B$, and $l_C$ are dimensions at room temperature.

3. A sintering fixture as claimed in claim 2, characterized in that:

the frame is substantially square with four sides of equal lengths;

the fixture comprises first and second pairs of compensating inserts of substantially equal lengths, each compensating insert being arranged adjacent one side of the frame; and the workpiece is substantially square.

4. A sintering fixture as claimed in claim 2, characterized in that $l_A$ and $l_C$ are diameters, and $l_B$ is a thickness of a ring.

5. A sintering fixture as claimed in claim 2, characterized in that:

the frame consists essentially of molybdenum; and the compensating inserts consist essentially of one or more of copper and nickel or stainless steel.

* * * * *